(12) United States Patent
Abessolo Bidzo

(10) Patent No.: US 12,484,311 B2
(45) Date of Patent: Nov. 25, 2025

(54) ESD CLAMP CIRCUIT WITH VERTICAL BIPOLAR TRANSISTOR

(71) Applicant: NXP B.V., Eindhoven (NL)

(72) Inventor: Dolphin Abessolo Bidzo, Nijmegen (NL)

(73) Assignee: NXP B.V., Eindhoven (NL)

( * ) Notice: Subject to any disclaimer, the term of this patent is extended or adjusted under 35 U.S.C. 154(b) by 574 days.

(21) Appl. No.: 17/936,475

(22) Filed: Sep. 29, 2022

(65) Prior Publication Data

US 2024/0113100 A1  Apr. 4, 2024

(51) Int. Cl.
*H10D 89/60* (2025.01)
*H02H 9/04* (2006.01)

(52) U.S. Cl.
CPC .......... *H10D 89/711* (2025.01); *H02H 9/046* (2013.01); *H10D 89/911* (2025.01); *H10D 89/611* (2025.01)

(58) Field of Classification Search
CPC .. H10D 89/711; H10D 89/911; H10D 89/611; H02H 9/046
USPC .......................................................... 361/56
See application file for complete search history.

(56) References Cited

U.S. PATENT DOCUMENTS

| | | | |
|---|---|---|---|
| 6,492,859 B2 * | 12/2002 | Vashchenko | H10D 89/711 361/111 |
| 7,541,648 B2 | 6/2009 | Jin | |
| 8,284,530 B1 | 10/2012 | Vashchenko et al. | |
| 8,630,072 B2 * | 1/2014 | Smith | H10D 89/711 361/56 |
| 10,366,974 B2 | 7/2019 | De Raad et al. | |
| 2004/0129983 A1 * | 7/2004 | Mallikarjunaswamy | H10D 12/411 257/370 |
| 2004/0137690 A1 * | 7/2004 | Mallikarjunaswamy | H10D 12/411 438/322 |
| 2005/0083618 A1 * | 4/2005 | Steinhoff | H10D 10/421 257/E29.184 |
| 2005/0286188 A1 * | 12/2005 | Camp | H10D 89/713 361/56 |
| 2007/0002508 A1 * | 1/2007 | Vanysacker | H10D 89/713 361/56 |

(Continued)

FOREIGN PATENT DOCUMENTS

| | | |
|---|---|---|
| CN | 111584481 A | 8/2020 |
| JP | 5253742 B2 | 7/2013 |

OTHER PUBLICATIONS

Abessolo-Bidzo, D., "A Silicon BJT Active ESD Clamp Design in a Silicon Germanium HBT BiCMOS Technology", 2021 43rd Annual EOS/ESD Sympoisum (EOS/ESD), DOI: 10.23919/EOS/ESD52038.2021.9574703, Sep. 26, 2021-Oct. 1, 2021.

(Continued)

*Primary Examiner* — Dharti H Patel
(74) *Attorney, Agent, or Firm* — David G. Dolezal

(57) ABSTRACT

A semiconductor die has ESD clamp circuits that include vertical PNP transistors. The vertical PNP transistors include at least one region in a semiconductor substrate that is substrate isolated from a biased portion of the substrate. The ESD clamp circuits include a resistive element that is electrically coupled in a conductive path between the emitter and base of the vertical PNP transistor. The PNP transistor is conductive during certain ESD events to discharge ESD charge from the emitter to the collector.

20 Claims, 5 Drawing Sheets

(56) References Cited

U.S. PATENT DOCUMENTS

| | | | |
|---|---|---|---|
| 2008/0316659 A1* | 12/2008 | Oguzman | H10D 89/711 |
| | | | 361/111 |
| 2012/0127617 A1* | 5/2012 | Werner | H10D 89/713 |
| | | | 361/56 |
| 2015/0070806 A1* | 3/2015 | Parthasarathy | H02H 9/04 |
| | | | 361/57 |
| 2016/0285260 A1* | 9/2016 | Kawasoe | H02H 9/046 |
| 2023/0223750 A1* | 7/2023 | Ritter | H01L 24/48 |
| | | | 361/56 |

OTHER PUBLICATIONS

Vashchenko, V.A., "Implementation of dual-direction SCR devices in analog CMOS process", 2007 29th Electrical Overstress/Electrostatic Discharge Symposium (EOS/ESD), DOI: 10.1109/EOSESD.2007.4401734, Sep. 16-21, 2007.

Voegeli, B., "High Performance, Low Complexity Vertical PNP BJT Optimization for a 0.24 μm SiGe BiCMOS Technology", 2007 Topical Meeting on Silicon Monolithic Integrated Circuits in RF Systems, DOI: 10.1109/SMIC.2007.322774, Mar. 5, 2007.

* cited by examiner

ESD CLAMP CIRCUIT WITH VERTICAL BIPOLAR TRANSISTOR

BACKGROUND OF THE INVENTION

Field of the Invention

This invention relates in general to semiconductor die with ESD clamp circuits that include vertical bipolar transistors.

Description of the Related Art

Some semiconductor die utilize electrostatic discharge (ESD) clamp circuits for discharging charge from an ESD event affecting a die terminal. An ESD event may occur when a charged object (e.g., a human finger) inadvertently contacts a conductive surface of a semiconductor die (e.g., a contact pad) or a conductive surface of a semiconductor die package coupled to the pad where charge at an elevated voltage is applied to the conductive surface due to the contact. Being at an elevated voltage, such charge may cause voltage differentials across the devices of the integrated circuit that may exceed their safe operating areas and damage those devices. An ESD event may also occur when a charged conductive surface of a circuit contacts an external object where charge is transferred between the conductive surface and the external object.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a semiconductor die has ESD clamp circuits that include vertical PNP transistors. The vertical PNP transistors include at least one region in a semiconductor substrate that is substrate isolated from a biased portion of the substrate. The ESD clamp circuits include a resistive element that is electrically coupled in a conductive path between the emitter and base of the vertical PNP transistor. The PNP transistor is conductive during certain ESD events to discharge ESD charge from the emitter to the collector.

In one embodiment, providing an ESD clamp circuit with a vertical PNP transistor with at least one isolated region and a resistive element between the emitter and base may provide for transistor with minimal voltage snap back that is more compact and has a higher breakdown voltage than a clamp circuit with a lateral PNP transistor. The substrate isolation of the at least one region of the vertical PNP transistor may allow for the ESD clamp circuit to be used in a semiconductor die where the substrate includes portions that are biased at a negative voltage.

Figure 1:
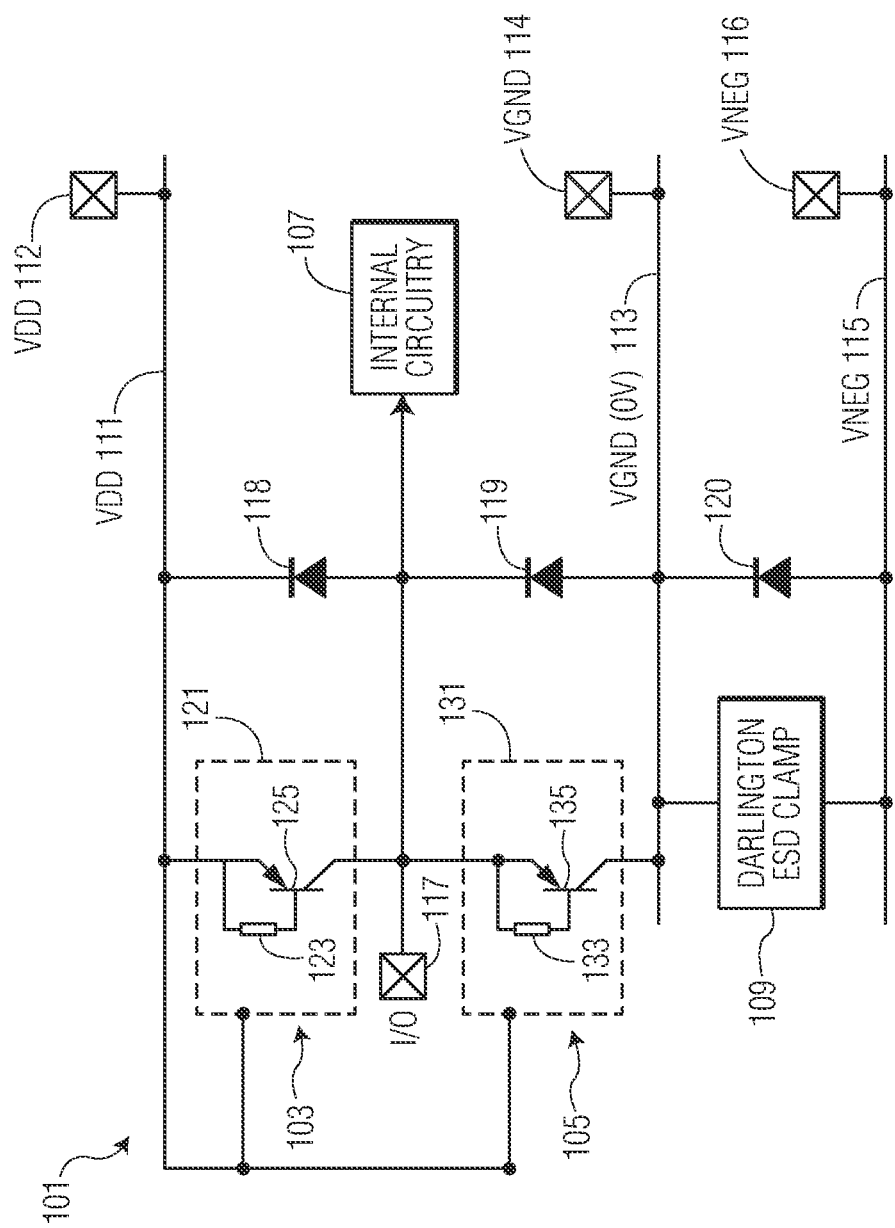
FIG. 1 is a circuit diagram of a portion of a semiconductor die according to one embodiment of the present invention.

FIG. 1 is a circuit diagram of a portion of a semiconductor die 101 including ESD protection circuitry according to one embodiment of the present invention. Die 101 includes an I/O external die terminal 101 that is used to exchange signals with internal circuitry 107 of die 101 and with circuitry (not shown) external to die 101. In one embodiment, internal circuitry 107 can include digital, analog, mixed signal or other types of circuitry. In one embodiment, I/O external die terminals convey digital signals (e.g., such digital data signals), but may also convey analog signals in other embodiments. In one embodiments, I/O external die terminal 116 is implemented with a die pad, but may be implemented with other types of die terminals (e.g., bumps, posts) in other embodiments.

In some embodiments, die 101 is encapsulated with an encapsulate (e.g., molding compound, epoxy, or plastic (not shown)) to form a semiconductor die package where die 101 can be implemented in an electronic system such as an automobile control system, computer system, industrial control system, cellular phone, or communication device etc. The die terminals would be electrically connected to external terminals (not shown) of the IC package (not shown) with conductive structures of the die package (e.g., bond wires, solder, traces).

Semiconductor die 101 includes voltage supply busses 111, 113, and 115 for supplying supply voltages to internal circuitry 107. Supply bus 111 supplies a high supply voltage VDD (e.g., 5V), supply voltage bus 113 supplies a ground voltage VGND (e.g., 0V), and supply bus 115 supplies a negative supply voltage VNEG (e.g., −8V), however, these voltages may be of other values in other embodiments. Also, other embodiments may include a different number of supply busses for providing a different number of supply voltages.

Supply bus 111 is biased by die terminal 112, supply bus 113 is biased by die terminal 114, and supply bus 115 is biased by die terminal 116. In some embodiments, these supply terminals can be implemented as die pads, however, they may be implemented by other types of die terminals such as die bumps or posts. These supply terminals can be electrically coupled to power supplies (not shown) that provide the specified supply voltages during circuit operation. In some embodiments, the power supply busses may be biased by multiple supply voltage terminals at various locations around the die for supply voltage integrity on the bus.

Die 101 includes ESD circuitry for protecting internal circuitry 107 from ESD charge accumulating on die terminals (112, 114, 116, and 117) due to an ESD event at the die terminal or at a package terminal coupled to the die terminal if the die is packaged in a semiconductor package. For example, die 101 includes diodes 118, 119, 120 for discharging "negative" ESD charge that occurs when, because of the ESD event, a lower voltage bus is placed at a voltage that is greater than the voltage of the higher voltage bus. Under such conditions, current will flow from the lower voltage bus to higher voltage bus through the diodes to reduce the voltage differential. For example, diode 120 provides a path for ESD current from bus 115 to flow to ground bus 113. Diode 119 provides a path for ESD current from bus 113 to flow through diode 118 to bus 111. Diode 118 provides a path for ESD current from I/O terminal 117 or diode 119 to flow to VDD bus 111.

Die 101 includes clamp circuits 103, 105 and 109 for discharging "positive" ESD charge from a higher voltage bus or conductive structure to a lower voltage bus. In the embodiment shown, clamp circuit 109 discharges positive ESD charge occurring on bus 113 to bus 115 when the voltage differential between bus 113 and 115 exceeds a threshold amount due to an ESD event affecting terminal 114 or at package terminal (not shown) coupled to terminal 114. In the embodiment shown, clamp circuit 109 is a Darlington ESD clamp circuit with an active bipolar ESD clamp where its transistors are arranged in a Darlington configuration. In one embodiment, clamp circuit 109 includes a trigger circuit and a power stage (both not shown) that are connected to busses 113 and 115 and assert a trigger signal to make clamp circuit 109 conductive, when an ESD event is detected. In other embodiments, circuit 109 may be another type of ESD clamp circuit.

Die 101 includes clamp circuits 103 and 105 that each include a vertical PNP transistor (125 and 135, respectively). The emitter of transistor 125 is electrically connected to bus 111. The collector of transistor 125 is electrically connected to terminal 117 and to the emitter of transistor 135. Circuit 103 includes a resistor circuit 123 for providing a resistance in a current path between the emitter of transistor 125 and the base of transistor 125.

The emitter of transistor 135 is electrically connected to terminal 117 and to the collector of transistor 125. The collector of transistor 135 is electrically connected to bus 113. Circuit 105 includes a resistor circuit 133 for providing a resistance in the current path between the emitter of transistor 135 and the base of transistor 135. Resistor circuits 123 and 133 are set to define the trigger voltage and trigger current of transistors 125 and 135 during an ESD event to make transistors 125 and 135 conductive. In one embodiment, the resistance of each of resistor circuits 123 and 133 is approximately 10 K ohms, but may be of other values in other embodiments, depending upon a desired trigger voltage.

Circuits 103 and 105 each include a buried N type isolating layer (121 and 131, respectively), to substrate isolate regions of transistors 125 and 135, respectively, from the substrate bias voltage source which is VNEG terminal 116. The buried N type isolating layers of each circuit are biased at VDD for latch up immunity, but may be biased at other voltages in other embodiments. In other embodiments, regions of transistors 125 and 135 maybe substrate isolated from the substrate biasing source by other structures, e.g., by deep trenches isolation or isolation layers.

In one embodiment, substrate isolating the substrate regions of transistors 125 and 135 from the substrate portion biased at VNEG (see portion 207 of FIG. 2) may prevent the transistor of a clamp circuit from absorbing the entire voltage drop between the high supply voltage (VDD) and the substrate supply voltage (VNEG) during an ESD event. Accordingly, in some embodiments, transistors 125 and 135 may be implemented with lower voltage transistors in that the regions of those transistors in the substrate are substrate isolated from the substrate biased region.

In regard to an ESD event affecting bus 111 where ESD charge accumulates on bus 111 to raise its voltage above a threshold voltage, the increase in voltage on bus 111 above the threshold causes current to flow through resistor circuit 123 to the base of transistor 125 which causes transistor 125 to conduct current from its emitter to collector to pull the voltage of the emitter of transistor 135 higher above a threshold. The increase in voltage of the emitter of transistor 135 above a threshold voltage (which is the collector-emitter breakdown voltage with the base terminal electrically coupled to the emitter terminal through a specific resistance) causes current to flow through resistor circuit 133 which causes transistor 125 to conduct current from its emitter to collector to discharge the ESD charge to ground bus 113.

In regard to an ESD event affecting I/O terminal 117 where ESD charge accumulates at terminal 117 to increase its voltage above a threshold voltage, which is the collector-emitter breakdown voltage with the base terminal electrically coupled to the emitter terminal through a specific resistance) the increase in voltage of the emitter of transistor 135 causes current to flow through resistor circuit 133 which causes transistor 135 to conduct current from its emitter to collector to discharge the ESD charge to ground bus 113.

In some embodiments, ESD charge at bus 111 or terminal 117 may raise the voltage significantly such that the clamp circuits 103 and 105 being conductive raise the voltage of bus 113 is a short amount of time such that a trigger circuit (not shown) makes clamp circuit 109 conductive to discharge current to bus 115.

Other semiconductor dies may have different configurations in other embodiments, including different configuration of the ESD circuits.

Figure 2:
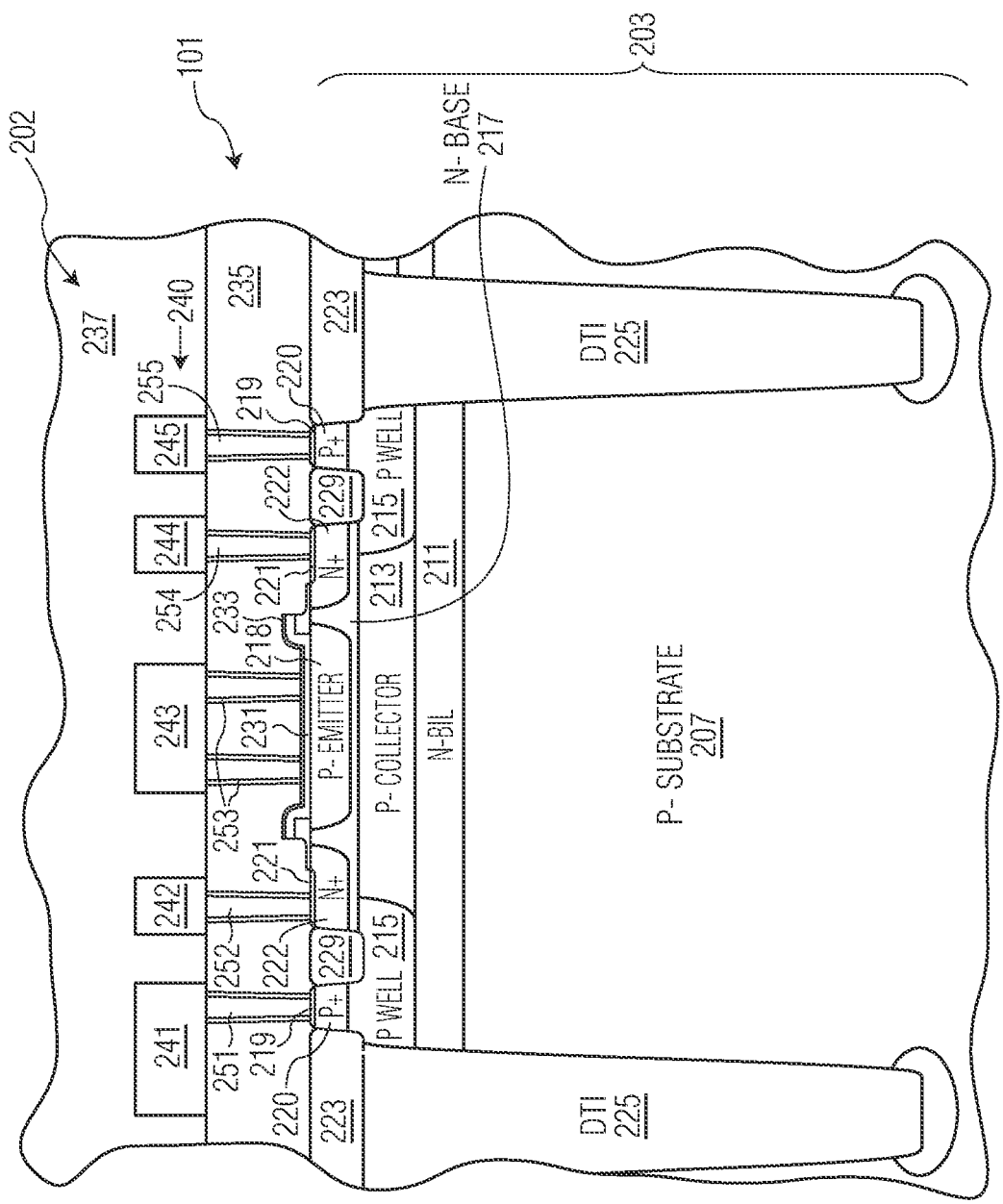
FIG. 2 is a partial cutaway side view of a semiconductor die according to one embodiment of the present invention.

FIG. 2 is a partial cross sectional side view of semiconductor die 101 showing a PNP vertical transistor 202 according to one embodiment of the present invention. In one embodiment, transistors 125 and 135 of FIG. 1 may each be implemented with a transistor similar to transistor 202.

Die 101 includes a semiconductor substrate 203 with regions of different net conductivity doping types and with dielectric structures. As used herein, the designation of a semiconductor region as an "N" or "P" or as "N type" or "P type" denotes the net conductivity dopant concentration of the region. An "N" or "N type" indicates that the region has a net N type conductivity dopant concentration (e.g., of phosphorous, arsenic) and a "P" or "P type" indicates that the region as a net P type conductivity dopant concentration (e.g., of boron). The designations of 1) "+," 2) "−," or 3) no designation of "+" or "−" next to the N or P indicates the relative net concentration of the conductivity dopant. A "+" indicates a higher net concentration than no designation of "+" or "−," and a "−" indicates a lower net concentration than no designation of "+" or "−." These regions of different conductivity dopant concentrations can be formed by one or more conductivity dopant ion implantation processes, be formed in-situ during semiconductor material formation, or be formed by dopant diffusion from other regions. In one embodiment, a region with a designation of "P+" has a net conductivity dopant concentration in the range of 0.5-2 $E10^{20}$ per $cm^{-3}$. A region with a designation of "P" has a net conductivity dopant concentration in the range of 0.05-2 $E10^{18}$ per $cm^{-3}$. A region with a designation of "P−" has a net conductivity dopant concentration in the range of 0.5-2 $E10^{14}$ per $cm^{-3}$. A region with a designation of "N+" has a net conductivity dopant concentration in the range of 0.5-2 $E10^{20}$ per $cm^{-3}$. A region with a designation of "N" has a net conductivity dopant concentration in the range of 0.5-2 $E10^{18}$ per $cm^{-3}$. A region with a designation of "N−" has a net conductivity dopant concentration in the range of 0.05-2 $E10^{17}$ per $cm^{-3}$. However, these designations may represent other values in other embodiments. Also, the identified regions in the Figures may have other relative doping concentrations in other embodiments.

In one embodiment, substrate 203 includes semiconductor material (e.g., silicon, silicon germanium, silicon carbide, gallium nitride, other III-V semiconductor material) and may include dielectric structures e.g., buried oxide layers or shallow trench isolation 229, and deep trench structure 225. Substrate 203 may also include other semiconductor devices (not shown) located outside the view of FIG. 2. In one embodiment, structure 225 is made of oxide.

Substrate 203 includes a substrate biased portion 207 having a net P– doping concentration. Portion 207 is biased by bus VNEG 115 through interconnect 335 and contact 331 (See FIG. 3). Transistor 202 includes a P– doped emitter region 218, an N– doped base region 217, and a P– doped collector region 213, all located in substrate 203. N+ base contact regions 222 laterally surrounds emitter region 218 and is in a path with base region 217. P+ collector contact region 220 laterally surround region 218 and region 222 and is in a conductive path with collector region 213 through P well 215. Shallow trench isolation 229 is made of an oxide and laterally separates contact region 222 from contact region 220.

An emitter electrode 231 is located directionally above and is in electrical contract with emitter region 218. In one embodiment, emitter electrode 231 is made of poly silicon doped with P type dopants. In some embodiments, P type dopants from emitter electrode 231 diffuse into substrate 203 to form region 218. Regions 220 and 222, and electrode 231 are each silicided with a metal silicide (e.g., cobalt silicide) 219, 221, and 233, respectively.

One or more layers of dielectric material 235 are located above substrate 203. Conductive collector contacts 251 and 255 are formed in material 235 to electrically contact collector silicide 219. Base contacts 252 and 254 are formed in material 235 and electrically contact base silicide 221. Emitter contacts 253 are formed in material 235 and electrically contact electrode silicide 233. In one embodiment, these contacts are made of one or more layers of contact material (e.g., copper, tungsten, titanium).

Die 101 includes a conductive interconnect layer 240 with conductive interconnects 241, 242, 243, 244, and 245 that electrically contact conductive contacts 251, 252, 253, 254, and 255 respectively for carrying signal and bias voltages to collector region 213, base region 217, and emitter region 218. Interconnects 241, 242, 243, 244, and 245 are located in a dialectic layer 237. Not shown in FIG. 2 are interconnect layers located above layer 237 nor the conductive vias that are electrically connected to interconnects 241, 242, 243, 244, and 245, which may be located in areas not in the cutaway view of FIG. 2. Also not shown in Figure are the die terminals (e.g., pads, bumps, posts) that are located above layer 237.

As shown in FIG. 2, transistor 202 is a vertical PNP bipolar transistor. A vertical PNP transistor is a transistor where the intrinsic base (located in region 217) is located directly between the emitter and collector of the transistor in a vertical line. Generally, an intrinsic base is the portion of the base region of a transistor through which the collector-emitter current flows.

In one embodiment, implementing a vertical PNP for an ESD clamp may provide for a more compact clamp circuit than with a lateral parasitic PNP transistor in a CMOS device. Furthermore, in some embodiments, using a vertical PNP transistor may provide for a clamp circuit with a higher breakdown voltage, thereby allowing for lower rated devices to be used. Furthermore, in some embodiments, utilizing a vertical PNP transistor for an ESD clamp circuit may provide for a circuit that can be more easily scalable with respect to changing process critical dimensions.

In addition, in some embodiments, utilizing a vertical PNP transistor with a properly sized resistor circuit between the emitter and base (e.g., resistor circuits 123 and 133) may provide for a clamp circuit with little to no snap back voltage such the trigger voltage of the clamp approximately equals the holding voltage of the clamp. For example, in one embodiment where the resistance of the resistor circuit is approximately 10K ohms, the trigger voltage of the clamp circuit and the holding voltage is approximately 6V. With such an embodiment, the voltage at failure is approximately 9V. Other embodiments of clamp circuits may have resistances and/or other threshold voltages of other values.

Referring back to FIG. 2, substrate 203 includes a deep trench isolation structure located laterally around the substrate regions (e.g., collector region 213, emitter region 218 and base region 217 as well as contact regions 220 and 222) of transistor 202. In the embodiment shown, the deep trench isolation structure includes deep trench structure 225 and a shallow trench isolation structure 223 that is located over structure 225. Other types of isolation trenches may be utilized in other embodiments.

Die 101 also includes a buried N type isolation layer 211 (N– BIL layer 211). In one embodiment, layers 121 and 131 of FIG. 1 may be implemented with a layer similar to layer 211. Layer 211 extends laterally to the inner edge of structure 225 to substrate isolate the regions of transistor 202 from the region 207, which is biased at VNEG. As used herein, first region is "substrate isolated" from a second region if there is no substrate only conductive path between the two regions. As shown in FIG. 2, N type layer 211 separates the P type substrate portion 207 from P well 215 and P type collector 213.

In one embodiment, die 101 includes CMOS transistors (not shown) where base region 217 and collector region 213 and well 213 are implanted after the CMOS wells are formed and prior to final well anneal and gate oxide formation. In one embodiment, layer 211 is deeper than region a typical CMOS N well. In one embodiment, layer 211 is formed by implanting phosphorous ions at a concentration of 1e13 per $cm^3$ and at an energy of 1.4 MeV. Region 213 is formed by implanting boron ions at a dose of 2e13 per $cm^3$ and at an energy of 450 KeV and at a dose of 9e11 per $cm^3$ and at an energy of 120 KeV. However, these regions may be implanted with other conductivity dopants, at other dosages, and/or at other energies in other embodiments.

In other embodiments, a vertical PNP transistor may include other configurations. For example, in some embodiments, the emitter may be located in a polysilicon region, or in regions located above substrate 203. Also in other embodiments, contact regions 220 and 222 may not completely surround emitter region 218.

Figure 3:
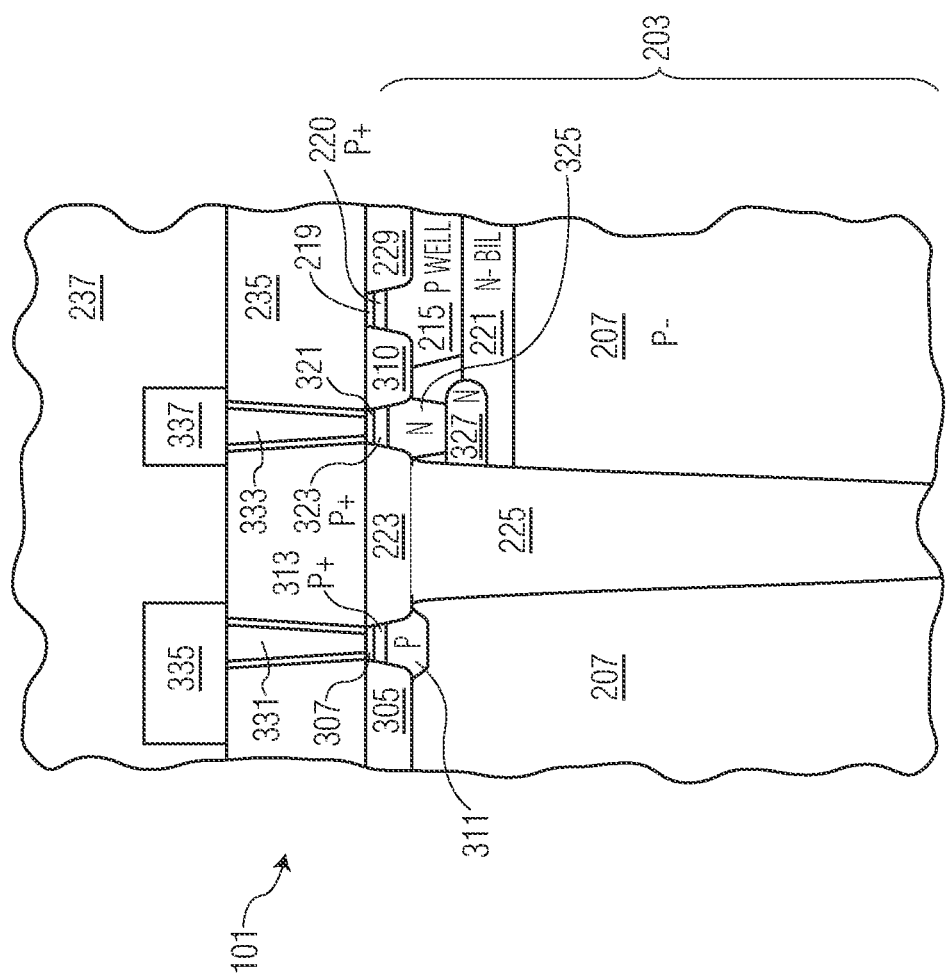
FIG. 3 is another partial cutaway side view of a semiconductor die according to one embodiment of the present invention.

FIG. 3 is a partial cross section side view of die 101 at another location from the view of FIG. 2. FIG. 3 shows the biasing of N-BIL layer 211 and substrate biased portion 207.

In the embodiment shown, layer 211 is biased through interconnect 337 in dielectric layer 237, contact 333 in material 235, silicide 321, N+ contact region 323, and N sinker regions 325 and 327. In the embodiment of FIG. 1, interconnect 337 is electrically coupled to bus 111 for biasing layer 211 at VDD, although layer 211 may be biased at other voltages in other embodiments. Isolation trench 310 laterally separates regions 323 and 325 from region 220 and region 215.

FIG. 3 also shows the biasing structures for biasing substrate portion 207. Portion 207 is biased through interconnect 335, contact 331, silicide 307, contact region 315, and P sinker region 311. In the embodiment of FIG. 1, interconnect 335 is electrically coupled to VNEG bus 115. In one embodiment, portion 207 may include multiple contact regions similar to region 313 located throughout die 101 that are coupled to the VNEG bus 115 through contacts and interconnects (not shown). In other embodiments, layer 211 and portion 207 may be coupled to voltage supply busses by other techniques in other embodiments. In some embodiments, portion 207 may be biased by a back side contact (not shown).

Figure 4:
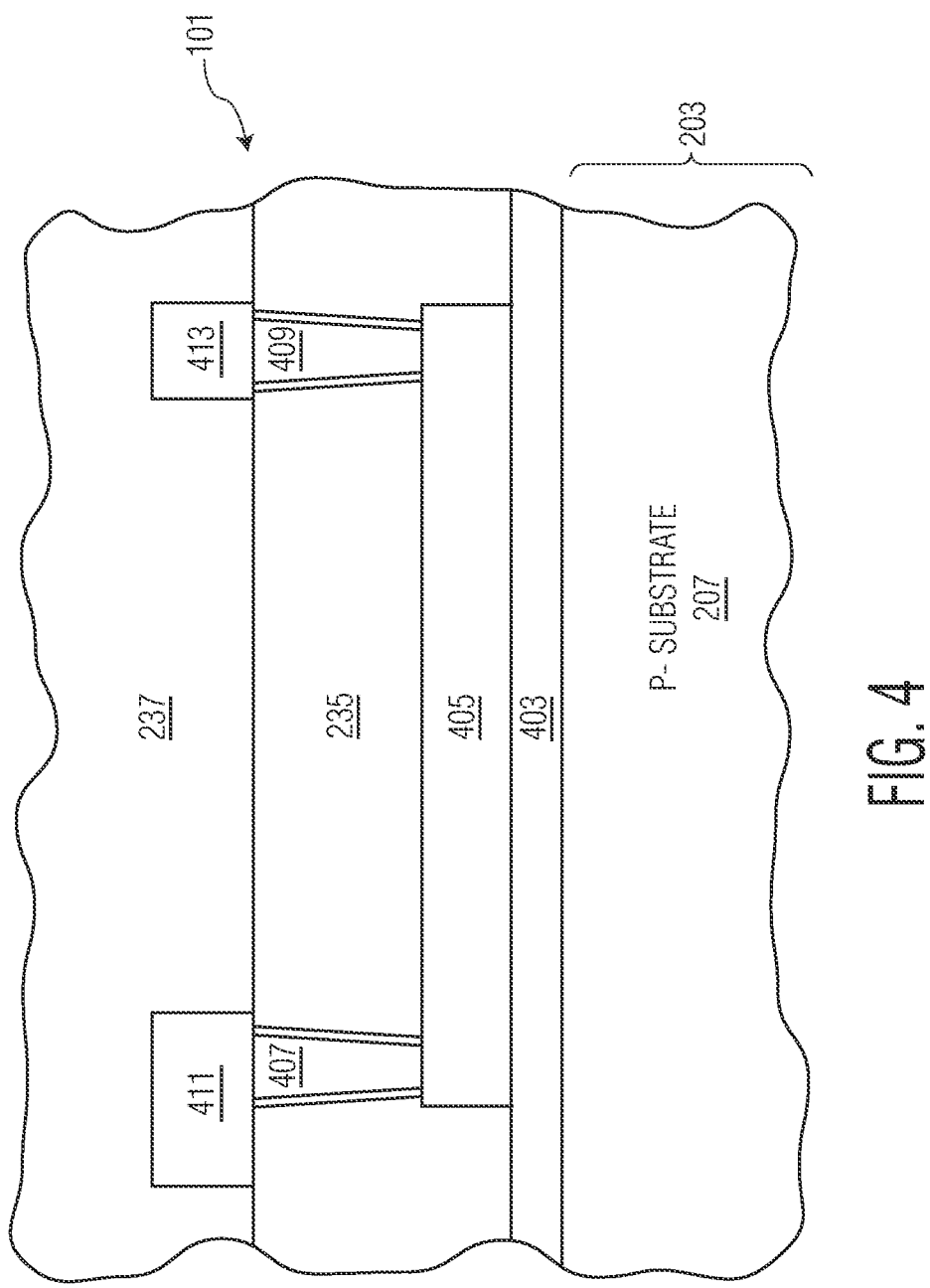
FIG. 4 is another partial cutaway side view of a semiconductor die according to one embodiment of the present invention.

FIG. 4 is a partial cross sectional side view of die 101 at another location from the views of FIGS. 2 and 3. FIG. 4 shows an embodiment of a resistor 405 that can be used for resistor circuits 123 and 133 of FIG. 1. In the embodiment shown, resistor 405 is implemented as a strip of poly silicon with a conductivity dopant of a dosage that for the length and cross sectional area of resistor 405, provides the desired resistance (e.g., 10K ohms in some embodiments). Poly resistor 405 is located in material 235 on a dielectric layer 403 (e.g., oxide), which in one embodiment is located over portion 207 of substrate 203. In some embodiments, layer 403 may be located over shallow trench isolation (not shown) to reduce capacitance with portion 207.

Contacts 407 and 409 are connected to the two terminal ends of resistor 405. Contact 407 is electrically connected to interconnect 411 and contact 409 is electrically connected to interconnect 413. In one embodiment, interconnect 411 is electrically coupled to base interconnects 242 and 244 and interconnect 413 is electrically coupled to emitter interconnect 243 such that resistor 405 provides a resistance in a path between emitter region 218 and base region 217. In other embodiments, other types of resistors may be used.

Figure 5:
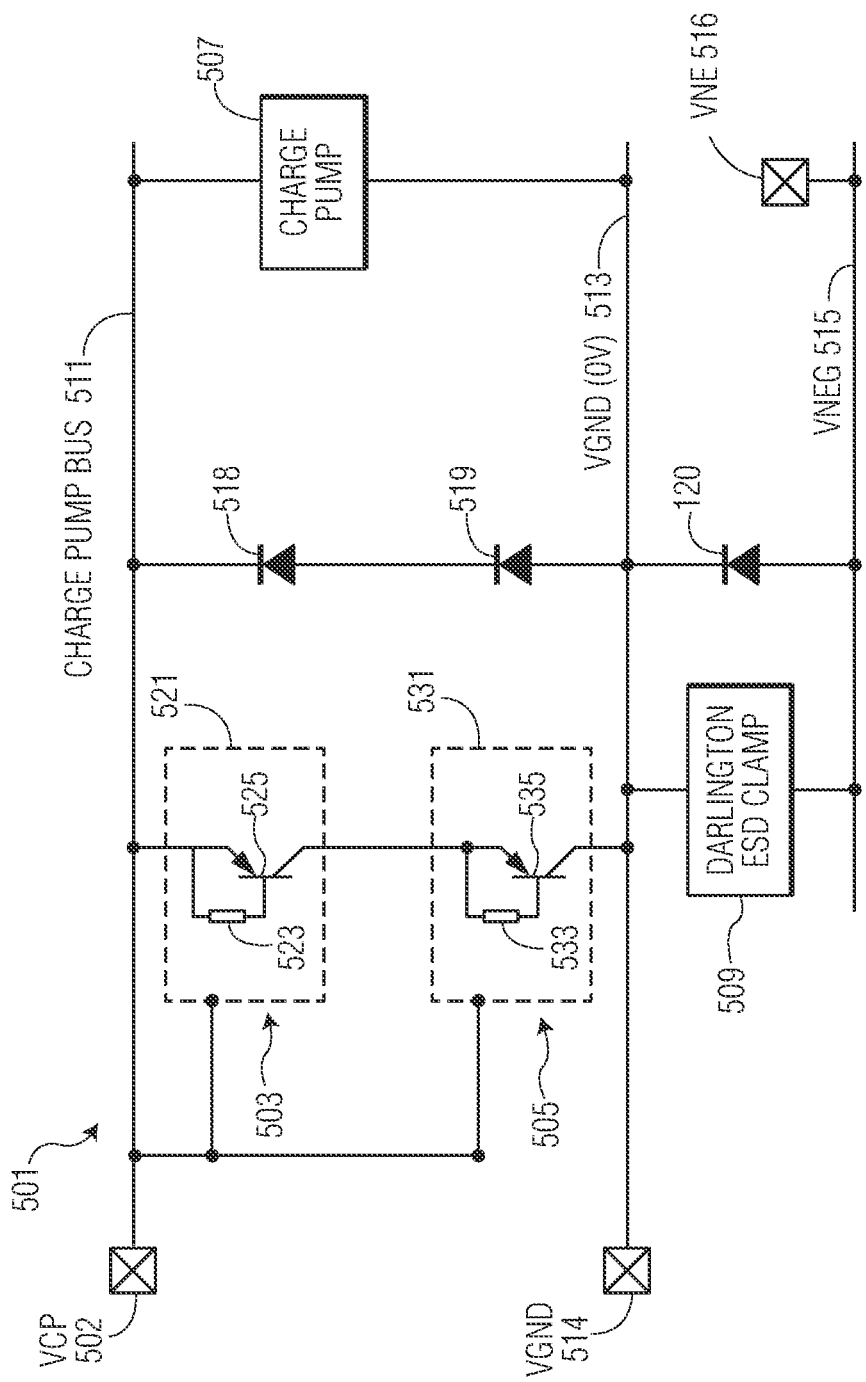
FIG. 5 is a circuit diagram of a portion of a die according to one embodiment of the present invention.

FIG. 5 is a circuit diagram of a portion of a semiconductor die 501 including ESD protection circuitry according to another embodiment of the present invention. FIG. 5 includes a charge pump 507 that is used to provide a higher voltage VCP (e.g., 10 V) on charge pump bus 511, which is higher than supply voltage VDD supplied to a circuit. Die 501 includes an external die terminal 502 connected to bus 511 for providing the elevated voltage VCP to external circuitry. Die 501 includes a ground bus 513 that is biased by a ground external terminal 514, and a negative voltage supply bus 515 that is biased by terminal 516 at a negative voltage (e.g., −8V). Thus, busses may be biased at other voltages in other embodiments.

Die 501 includes ESD circuitry for protecting charge pump 507 and other circuitry from ESD charge at the die terminals (502, 514, and 516) due to an ESD event at the die terminal or at a package terminal coupled to the die terminal if the die is packaged in a semiconductor package. Die 501 includes diodes 518, 519, 520 for discharging "negative" ESD charge. For example, diode 520 provides a path for ESD current from bus 515 to flow to ground bus 513. Diodes 519 and 518 provide a path for ESD current to flow from bus 513 to bus 511.

Die 501 includes clamp circuits 503, 505 and 509 for discharging "positive" ESD charge from a higher voltage bus or conductive structure to a lower voltage bus. In the embodiment shown, clamp circuit 509 discharges ESD current occurring on bus 513 to bus 515 when the voltage differential between bus 513 and 515 exceeds a threshold amount due to an ESD event affecting terminal 514 or at a package terminal coupled to terminal 514. In the embodiment shown, clamp circuit 109 is a Darlington ESD clamp.

In one embodiment, clamp circuit 509 includes a trigger circuit (not shown) that is connected to busses 513 and 515 and asserts a trigger signal to make clamp circuit 509 conductive when an ESD event is detected. In other embodiments, circuit 509 may be another type of ESD clamp circuit.

Die 501 includes clamp circuits 503 and 505 that each include a vertical PNP transistor (525 and 535, respectively). The emitter of transistor 525 is electrically connected to bus 511. The collector of transistor 525 is electrically connected to the emitter of transistor 535. Circuit 503 includes a resistor circuit 523 for providing a resistance between the emitter of transistor 525 and the base of transistor 525.

The emitter of transistor 535 is electrically connected to the collector of transistor 525. The collector of transistor 535 is electrically connected to bus 513. Circuit 505 includes a resistor circuit 533 for providing a resistance between the emitter of transistor 535 and the base of transistor 535. Resistor circuits 523 and 533 are set to define the trigger voltage and trigger current of transistors 525 and 533 during an ESD event to make transistors 525 and 535 conductive. In one embodiment, the resistance of each of resistor circuits 523 and 533 is approximately 10 K ohms, but may be of other values in other embodiments.

Circuits 503 and 505 each include a buried N isolating layer 521 and 531, respectively, to substrate isolate regions of transistors 525 and 535, respectively, from the substrate bias voltage VNEG terminal 516. The buried N isolating layers of each circuit are biased at VDD for latch up immunity. In other embodiments, the regions of transistors 525 and 535 maybe substrate isolated from the substrate biasing source by other structures, e.g., by isolation trenches or isolation layers.

In one embodiment, substrate isolating the substrate regions of transistors 525 and 535 from the substrate portion biased at VNEG (see portion 207 of FIG. 2) may allow for a transistor in a clamp circuit not to absorb the entire voltage drop between the charge pump voltage VCP and the substrate supply voltage (VNEG) during an ESD event. Accordingly, in some embodiments, transistors 525 and 535 may be implemented with lower voltage transistors in that the regions of those transistors in the substrate are substrate isolated from the substrate biased region (207).

In regard to an ESD event affecting bus 511 where ESD charge accumulates on bus 511, the increase in voltage on bus 511 above a threshold causes current to flow through resistor circuit 523 to the base of transistor 525 which causes transistor 525 to conduct current from its emitter to collector to pull the voltage of the collector of transistor 535 higher. The increase in voltage of the collector of transistor 535 above a threshold causes current to flow through resistor 533 which causes transistor 535 to conduct current from its emitter to collector to discharge the ESD current to ground bus 513.

In some embodiments, ESD charge at bus 511 may raise the voltage significantly such that the clamp circuits 503 and 505 being conductive raises the voltage of bus 513 is a short amount of time such that a trigger circuit (not shown) makes clamp circuit 509 conductive to discharge ESD current to bus 515.

Other semiconductor dies may have different configurations in different embodiments, including a different configuration of the ESD circuits. For example, two clamp circuits similar to clamp circuits 103 and 105 may be located in series between an I/O terminal (e.g., 117) and a supply bus (e.g., ground bus 113).

As disclosed herein, a first structure or region is "directly over" a second structure or region if the first structure or region is located over the second structure or region in a line having a direction that is perpendicular with the generally planar major side of the substrate. For example, in FIG. 2, region 218 is directly over region 213. Region 218 is not directly over structure 225. As disclosed herein, a first structure or region is "directly beneath" a second structure or region if the first structure or region is located beneath the second structure region in a line having a direction that is perpendicular with the generally planar major side of the substrate. For example, in FIG. 2, region 213 is directly beneath region 218. Structure 225 is not directly beneath region 218. One structure or region is "directly between" two other structures or regions in a line if the two structures or regions are located on opposite sides of the one structure or region in the line. For example, in FIG. 2, region 218 is located directly between interconnect 243 and layer 211 in a vertical line. Structure 223 is not located directly between interconnect 243 and layer 211 in a line. A first structure or region is "directly lateral" to a second structure or region if the first structure or region and second structure or region are located in a line having a direction that is parallel with a generally planar major side of the substrate. For example, interconnects 243 and 244 are directly lateral to each other. Interconnect 245 is not directly lateral to structure 223. One structure or region is "directly laterally between" two other structures or regions if the two structures or regions are located on opposite sides of the one structure or region in a line that is parallel with a generally planar major side of the substrate. For example, in FIG. 2, interconnect 243 is located directly laterally between interconnects 242 and 244. A first structure or region laterally surrounds a second structure or region if the first structure or region surrounds the second structure or region in a line having a direction that is parallel with a generally planar major side of the substrate. A vertical line is a line that is perpendicular with a generally planar major side of the substrate.

Features specifically shown or described with respect to one embodiment set forth herein may be implemented in other embodiments set forth herein.

In one embodiment, a semiconductor die includes a semiconductor substrate including a doped substrate portion configured to be biased at a first supply voltage by a first supply voltage terminal. The semiconductor die includes a first ESD clamp circuit including a first PNP vertical transistor including at least one region located in the semiconductor substrate. The first PNP vertical transistor including a first collector region in the semiconductor substrate. The at least one region of the first PNP vertical transistor located in the semiconductor substrate is substrate isolated from the doped substrate portion. The first ESD clamp circuit including a first resistor circuit having a first terminal electrically coupled to a first emitter of the first PNP vertical transistor and a second terminal electrically coupled to a first base of the first PNP vertical transistor to provide a resistance in a current path between the first emitter and the first base. The semiconductor die including a second ESD clamp circuit including a second PNP vertical transistor including at least one region located in the semiconductor substrate. The second PNP vertical transistor including a second collector region in the semiconductor substrate electrically coupled to the first emitter. The second PNP vertical transistor including a second emitter electrically coupled to a die terminal. The at least one region of the second ESD clamp circuit located in the semiconductor substrate is substrate isolated from the doped substrate portion. The second ESD clamp circuit including a second resistor circuit having a first terminal electrically coupled to the second emitter of the second PNP vertical transistor and a second terminal electrically coupled to a second base of the second PNP vertical transistor to provide a resistance in a current path between the second emitter and the second base of the second PNP vertical transistor. During an ESD event affecting the die terminal, ESD charge at the die terminal is discharged through the second PNP vertical transistor being made conductive and through the first PNP vertical transistor being made conductive.

In another embodiment, a semiconductor die includes a semiconductor substrate including a doped substrate portion configured to be biased at a first supply voltage by a first supply voltage terminal. The semiconductor die including a first ESD clamp circuit including a first PNP vertical transistor including at least one region located in the semiconductor substrate. The first PNP vertical transistor including a first collector region in the semiconductor substrate. The first ESD clamp circuit including a first resistor circuit having a first terminal electrically coupled to a first emitter of the first PNP vertical transistor and a second terminal electrically coupled to a first base of the first PNP vertical transistor to provide a resistance in a current path between the first emitter and the first base. The first ESD clamp circuit including a first buried N type layer in the semiconductor substrate to provide substrate isolation between the doped substrate portion and the at least one region of the first PNP vertical transistor in the semiconductor substrate. The semiconductor die including a second ESD clamp circuit including a second PNP vertical transistor including at least one region located in the semiconductor substrate. The second PNP vertical transistor including a second collector region in the semiconductor substrate electrically coupled to the first emitter. The second PNP vertical transistor including a second emitter electrically coupled to a die terminal. The second ESD clamp circuit including a second resistor circuit having a first terminal electrically coupled to the second emitter of the second PNP vertical transistor and a second terminal electrically coupled to a second base of the second PNP vertical transistor to provide a resistance in a current path between the second emitter and the second base of the second PNP vertical transistor. The second ESD clamp circuit including a second buried N type layer in the semiconductor substrate to provide electrical isolation between the doped substrate portion and the at least one region of the second PNP vertical transistor in the semiconductor substrate. During an ESD affecting the die terminal, ESD charge at the die terminal is discharged through the second PNP vertical transistor being made conductive and the first PNP vertical transistor being made conductive.

In another embodiment, a semiconductor die includes a semiconductor substrate including a doped substrate portion configured to be biased at a first supply voltage by a first supply voltage terminal. The semiconductor die includes a first ESD clamp circuit having a first terminal coupled to the first supply voltage terminal and having a second terminal. The first ESD clamp circuit providing a conductive discharge path between the first terminal and the second terminal during an ESD event when being made conductive. The die includes a second ESD clamp circuit including a PNP vertical transistor including at least one region located in the semiconductor substrate. The PNP vertical transistor including a collector region in the semiconductor substrate coupled to the second terminal of the first ESD clamp circuit. The at least one region located in the semiconductor substrate is substrate isolated from the doped substrate portion. The second ESD clamp circuit includes a resistor circuit having a first terminal electrically coupled to an emitter of the PNP vertical transistor and a second terminal electrically coupled to a base of the PNP vertical transistor to provide a resistance in a current path between the emitter and the base. The semiconductor die including a die terminal. The emitter of the PNP vertical transistor is coupled to the die terminal. During an ESD event at the die terminal, ESD charge at the die terminal is discharged through the PNP vertical transistor being made conductive.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor die comprising:
   a semiconductor substrate including a doped substrate portion configured to be biased at a first supply voltage by a first supply voltage terminal;
   a first ESD clamp circuit including:
      a first PNP vertical transistor including at least one region located in the semiconductor substrate, the first PNP vertical transistor including a first collector region in the semiconductor substrate, wherein the at least one region of the first PNP vertical transistor located in the semiconductor substrate is substrate isolated from the doped substrate portion;
      a first resistor circuit having a first terminal electrically coupled to a first emitter of the first PNP vertical transistor and a second terminal electrically coupled to a first base of the first PNP vertical transistor to provide a resistance in a current path between the first emitter and the first base;
   a second ESD clamp circuit including:
      a second PNP vertical transistor including at least one region located in the semiconductor substrate, the second PNP vertical transistor including a second collector region in the semiconductor substrate electrically coupled to the first emitter, the second PNP vertical transistor including a second emitter electrically coupled to a die terminal, wherein the at least one region of the second ESD clamp circuit located in the semiconductor substrate is substrate isolated from the doped substrate portion;
      a second resistor circuit having a first terminal electrically coupled to the second emitter of the second PNP vertical transistor and a second terminal electrically coupled to a second base of the second PNP vertical transistor to provide a resistance in a current path between the second emitter and the second base of the second PNP vertical transistor;
      wherein during an ESD event affecting the die terminal, ESD charge at the die terminal is discharged through the second PNP vertical transistor being made conductive and through the first PNP vertical transistor being made conductive where ESD charge from the ESD event discharges through a path from the second collector region to the first emitter.

2. The semiconductor die of claim 1 further comprising a ground bus coupled to the first collector region, wherein during an ESD event, ESD charge at the first emitter is discharged through the first PNP vertical transistor being made conductive to the ground bus.

3. The semiconductor die of claim 2 wherein first supply voltage terminal is configured to supply the first supply voltage at a voltage below the voltage of the ground bus.

4. The semiconductor die of claim 1 further comprising:
   a first buried N type layer in the semiconductor substrate to provide electrical isolation between the doped substrate portion and the at least one region of the first PNP vertical transistor in the semiconductor substrate;
   a second buried N type layer in the semiconductor substrate to provide electrical isolation between the doped substrate portion and the at least one region of the second PNP vertical transistor in the semiconductor substrate.

5. The semiconductor die of claim 4 further comprising:
   the first buried N type layer is configured to be biased by the die terminal and the second buried N type layer is configured to be biased by the die terminal.

6. The semiconductor die of claim 4 further comprising:
   a first isolation trench structure laterally surrounding the first PNP vertical transistor, wherein lateral edges of the first buried N type layer extend to the first isolation trench structure;
   a second isolation trench structure laterally surrounding the second PNP vertical transistor, wherein lateral edges of the second buried N type layer extend to the second isolation trench structure.

7. The semiconductor die of claim 1 wherein:
   during an ESD event affecting the die terminal, a voltage of the first collector region is at a voltage level that is above a voltage of the first supply voltage terminal when the first PNP vertical transistor is being made conductive.

8. The semiconductor die of claim 1 wherein:
   a third ESD clamp circuit having a first terminal electrically coupled to the first collector region and having a second terminal coupled to the doped substrate portion, the first ESD clamp circuit providing a conductive discharge path between the first terminal of the third ESD clamp circuit and the second terminal of the third ESD clamp circuit to discharge ESD charge through the third ESD clamp circuit.

9. The semiconductor die of claim 1 wherein the die terminal is configured to supply a second supply voltage different than the first supply voltage.

10. The semiconductor die of claim 1 wherein the first supply voltage terminal is configured to be biased at a negative voltage.

11. The semiconductor die of claim 1 further comprising:
    a second die terminal, the first emitter of the first PNP vertical transistor is coupled to the second die terminal, wherein during an ESD event affecting the second die terminal, ESD charge at the second die terminal is discharged through the first PNP vertical transistor being made conductive.

12. The semiconductor die of claim 1 wherein at least some of ESD charge from the ESD event discharging from the second collector region flows through the first resistor.

13. A semiconductor die comprising:
    a semiconductor substrate including a doped substrate portion configured to be biased at a first supply voltage by a first supply voltage terminal;
    a first ESD clamp circuit including:
       a first PNP vertical transistor including at least one region located in the semiconductor substrate, the first PNP vertical transistor including a first collector region in the semiconductor substrate;

a first resistor circuit having a first terminal electrically coupled to a first emitter of the first PNP vertical transistor and a second terminal electrically coupled to a first base of the first PNP vertical transistor to provide a resistance in a current path between the first emitter and the first base;

a first buried N type layer in the semiconductor substrate to provide substrate isolation between the doped substrate portion and the at least one region of the first PNP vertical transistor in the semiconductor substrate;

a second ESD clamp circuit including:
a second PNP vertical transistor including at least one region located in the semiconductor substrate, the second PNP vertical transistor including a second collector region in the semiconductor substrate electrically coupled to the first emitter, the second PNP vertical transistor including a second emitter electrically coupled to a die terminal;

a second resistor circuit having a first terminal electrically coupled to the second emitter of the second PNP vertical transistor and a second terminal electrically coupled to a second base of the second PNP vertical transistor to provide a resistance in a current path between the second emitter and the second base of the second PNP vertical transistor;

a second buried N type layer in the semiconductor substrate to provide electrical isolation between the doped substrate portion and the at least one region of the second PNP vertical transistor in the semiconductor substrate;

wherein during an ESD affecting the die terminal, ESD charge at the die terminal is discharged through the second PNP vertical transistor being made conductive and the first PNP vertical transistor being made conductive.

14. The semiconductor die of claim 13 wherein the first buried N type layer is configured to be biased by the die terminal and the second buried N type layer is configured to be biased by the die terminal.

15. The semiconductor die of claim 13 further comprising:
a second die terminal, the first emitter of the first PNP vertical transistor is coupled to the second die terminal, wherein during an ESD event affecting the second die terminal, ESD charge at the second die terminal is discharged through the first PNP vertical transistor being made conductive.

16. The semiconductor die of claim 13 further comprising:
a first isolation trench structure laterally surrounding the first PNP vertical transistor, wherein lateral edges of the first buried N type layer extend to the first isolation trench structure;
a second isolation trench structure laterally surrounding the second PNP vertical transistor, wherein lateral edges of the second buried N type layer extend to the second isolation trench structure.

17. The semiconductor die of claim 13 wherein the first supply voltage terminal is configured to be biased at a negative voltage.

18. A semiconductor die comprising:
a semiconductor substrate including a doped substrate portion configured to be biased at a first supply voltage by a first supply voltage terminal;
a first ESD clamp circuit having a first terminal coupled to the first supply voltage terminal through a first voltage supply bus and having a second terminal, the first ESD clamp circuit providing a conductive discharge path between the first terminal and the second terminal during an ESD event when being made conductive;

a second ESD clamp circuit including:
a PNP vertical transistor including at least one region located in the semiconductor substrate, the PNP vertical transistor including a collector region in the semiconductor substrate coupled to the second terminal of the first ESD clamp circuit, wherein the at least one region located in the semiconductor substrate is substrate isolated from the doped substrate portion;

a resistor circuit having a first terminal electrically coupled to an emitter of the PNP vertical transistor and a second terminal electrically coupled to a base of the PNP vertical transistor to provide a resistance in a current path between the emitter and the base;

a die terminal, the emitter of the PNP vertical transistor is coupled to the die terminal, wherein during an ESD event at the die terminal, ESD charge at the die terminal is discharged through the PNP vertical transistor being made conductive;

a ground bus coupled to the collector region, wherein during an ESD event affecting the die terminal, ESD charge at the die terminal is discharged through the PNP vertical transistor being made conductive to the ground bus;

wherein first supply voltage terminal is configured to supply the first supply voltage at a voltage below the voltage of the ground bus;

wherein during an ESD event of a sufficient severity affecting the die terminal, ESD charge at the die terminal is discharged through a path to the first voltage supply bus where the path includes from the die terminal through the PNP vertical transistor being made conductive to the ground bus and from the ground bus through the first ESD clamp circuit being made conductive to the first voltage supply bus.

19. The semiconductor die of claim 18 further comprising:
a third ESD clamp circuit including:
a second PNP vertical transistor including at least one region located in the semiconductor substrate, the second PNP vertical transistor including a collector region in the semiconductor substrate coupled to the die terminal of the first ESD clamp circuit, the second PNP vertical transistor including an emitter electrically coupled to a second voltage supply terminal, wherein the at least one region located in the semiconductor substrate are substrate isolated from the doped substrate portion, wherein the second voltage supply terminal is configured to supply a second supply voltage different that the first supply voltage
a second resistor element having a first terminal electrically coupled to the emitter of the second PNP vertical transistor and a second terminal electrically coupled to a base of the second PNP vertical transistor to provide a resistance in a current path between the emitter and the base of the second PNP vertical transistor.

20. The semiconductor die of claim 18 wherein the first ESD clamp circuit is characterized as a Darlington clamp circuit.

* * * * *